United States Patent [19]
Hino

[11] Patent Number: 5,446,335
[45] Date of Patent: Aug. 29, 1995

[54] PIEZORESONATOR WITH A BUILT-IN CAPACITOR AND A MANUFACTURING METHOD THEREOF

[75] Inventor: Taketoshi Hino, Nagaokakyo, Japan

[73] Assignee: Murata Mfg. Co., Ltd., Japan

[21] Appl. No.: 197,730

[22] Filed: Feb. 17, 1994

[30] Foreign Application Priority Data

Feb. 19, 1993 [JP] Japan ................... 5-030716
Apr. 9, 1993 [JP] Japan ................... 5-082903

[51] Int. Cl.6 .............................. H03H 9/15
[52] U.S. Cl. .................. 310/359; 310/320; 310/366
[58] Field of Search ............... 310/320, 321, 348, 357, 310/359

[56] References Cited

U.S. PATENT DOCUMENTS

| | | | |
|---|---|---|---|
| 3,596,212 | 7/1971 | Pinner | 310/320 |
| 3,659,123 | 4/1972 | Oya | 310/357 |
| 4,013,982 | 3/1977 | Wood et al. | 310/357 |
| 4,109,359 | 8/1978 | Cross et al. | 310/359 |
| 4,384,229 | 5/1983 | Inoue et al. | 310/315 |
| 4,503,352 | 3/1985 | Inoue | 310/359 |
| 4,511,202 | 4/1985 | Kasai | 310/328 |
| 4,714,848 | 12/1987 | Chen | 310/359 |
| 4,833,430 | 5/1989 | Roberts et al. | 310/320 |
| 5,184,043 | 2/1993 | Yoshinaga | 310/320 |
| 5,310,511 | 5/1994 | Marcus | 310/357 |

FOREIGN PATENT DOCUMENTS

| | | | |
|---|---|---|---|
| 2853834 | 6/1979 | Germany | 310/320 |
| 0202112 | 12/1982 | Japan | 310/357 |
| 4082309 | 3/1992 | Japan | 310/357 |
| 4342308 | 11/1992 | Japan | 310/367 |

*Primary Examiner*—Thomas M. Dougherty
*Attorney, Agent, or Firm*—Ostrolenk, Faber, Gerb & Soffen

[57] ABSTRACT

A piezoresonator which has, on a piezoelectric substrate, a plurality of oscillation sections and a coupling capacitor section for electrically connecting the oscillation sections with each other. The piezoelectric substrate is polarized, while the portion holding the coupling capacitor section is partly left unpolarized. Alternatively, the piezoelectric substrate is entirely polarized such that the portion holding the coupling capacitor section has a lower intensity of polarization than the rest of the substrate. The polarization is carried out, for example, in the following process: first, a direct voltage is applied to the entire piezoelectric substrate so as to polarize the substrate entirely with a high intensity; and then, a direct voltage with the inverse polarity of the former direct current is applied only to the portion holding the coupling capacitor section so as to lower the intensity of polarization of the portion.

14 Claims, 4 Drawing Sheets

PIEZORESONATOR WITH A BUILT-IN CAPACITOR AND A MANUFACTURING METHOD THEREOF

BACKGROUND OF THE INVENTION

1. Field of the Invention

The present invention relates to a piezoresonator, and more particularly to a piezoresonator with a built-in capacitor to be employed in an oscillation circuit, a filter circuit or the like.

2. Description of Related Art

A piezoresonator which has, on a piezoelectric substrate, a plurality of oscillation sections and a coupling capacitor section for electrically connecting the oscillation sections has been conventionally known. In the piezoresonator, if the portion of the piezoelectric substrate which holds the coupling capacitor section is polarized, when the coupling capacitor section is impressed with a voltage, the coupling capacitor section vibrates because of electrostrictive effect. Thus, the coupling capacitor section acts as a vibrating section, which lowers the electrical characteristics of the piezoresonator.

The following two measures to avoid the problem have been conventionally taken:

(1) the portion of the piezoelectric substrate which holds the coupling capacitor section is entirely left unpolarized; and (2) the piezoelectric substrate is entirely polarized, while the coupling capacitor section is subjected to damping processing, such as, heaping solder on the capacitor electrodes of the coupling capacitor section and coating the capacitor electrodes with resin.

However, the measures (1) and (2) have disadvantages. A piezoresonator processed in the way of (1) has a small insertion loss but is poor in the flatness of group delay characteristic. A piezoresonator processed in the way of (2) is good in the flatness of group delay characteristic but has a large insertion loss.

SUMMARY OF THE INVENTION

An object of the present invention is to provide a piezoresonator which has a small insertion loss and is good in the flatness of group delay characteristic.

In order to attain the object, a piezoresonator has a piezoelectric substrate, on which a plurality of oscillation sections and a coupling capacitor section for electrically connecting the oscillation sections are provided, and the portion of the piezoelectric substrate which holds the coupling capacitor section is partly polarized. Because the portion of the piezoelectric substrate which holds the coupling capacitor section has an unpolarized part, the coupling capacitor section has a smaller dielectric loss, compared with a case wherein the portion holding the coupling capacitor section is entirely polarized. Accordingly, the insertion loss of the piezoresonator is small. Additionally, because the portion of the piezoelectric substrate which holds the coupling capacitor section has a polarized part, the piezoresonator is better in the flatness of group delay characteristic, compared with a case wherein the portion holding the coupling capacitor section is entirely left unpolarized.

In another piezoresonator according to the present invention, the piezoelectric substrate is entirely polarized such that the portion holding the coupling capacitor section has a lower intensity of polarization than the rest of the substrate. Because the intensity of polarization of the portion holding the coupling capacitor section is low, the coupling capacitor section has a lower dielectric loss, compared with a case wherein the piezoelectric substrate is entirely polarized with a high intensity. Accordingly, the piezoresonator has a smaller insertion loss. Additionally, because the portion holding the coupling capacitor section is polarized, the piezoresonator is better in the flatness of group delay characteristic, compared with a case wherein the portion holding the coupling capacitor section is entirely left unpolarized.

BRIEF DESCRIPTION OF THE DRAWINGS

This and other objects and features of the present invention will be apparent from the following description with reference to the accompanying drawings, in which.

DETAILED DESCRIPTION OF THE PREFERRED EMBODIMENTS

Some exemplary piezoresonators according to the present invention are described with reference to the accompanying drawings.

First Embodiment: FIGS. 1 through 4

Figure 1:
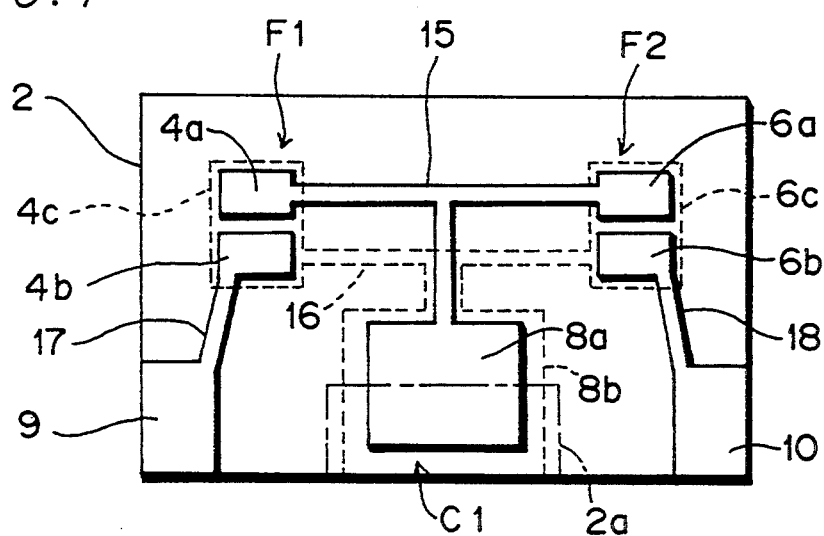
FIG. 1 is a plan view of a piezoelectric substrate of a piezoresonator which is a first embodiment of the present invention.

FIG. 1 shows a piezoelectric substrate 2 of a piezoresonator which is a first embodiment. The piezoelectric substrate 2 has two filter sections F1 and F2, and a coupling capacitor section C1. The piezoelectric substrate 2 is made of ceramic such as $Pb(ZrTi)O_3$ and $BaTlO_3$. The piezoelectric substrate 2 is polarized, while about a half of the portion holding the coupling capacitor section C1 is left unpolarized. (A part 2a enclosed by an alternate long and short dash line in FIG. 1 is left unpolarized.)

The filter section F1 comprises oscillation electrodes 4a and 4b which are formed on an upper side of the substrate 2 in the left, and an oscillation electrode 4c which is formed on a lower side of the substrate 2 facing the electrodes 4a and 4b. Likewise, the filter section F2 comprises oscillation electrodes 6a and 6b which are formed on the upper side of the substrate 2 in the right, and an oscillation electrode 6c which is formed on the lower side of the substrate 2 facing the electrodes 6a and 6b. The oscillation electrode 4a is connected with the oscillation electrode 6a via the junction line 15, and the oscillation electrode 4c is connected with -the oscillation electrode 6c via the junction line 16.

The coupling capacitor section C1 comprises capacitor electrodes 8a and 8b which are formed on respectively the upper side and the lower side of the substrate 2 facing each other in the middle. The capacitor electrode 8a is connected with the oscillation electrodes 4a and 6a via the junction line 15. The capacitor electrode 8b is connected with the oscillation electrodes 4c and 6c via the junction line 16. A part of the capacitor electrode 8b also functions as a common electrode. Since the portion of the substrate 2 which holds the coupling capacitor section C1 is only half polarized, the coupling capacitor section C1 has a small dielectric loss. Accordingly, the piezoresonator has a small insertion loss.

On the upper side of the substrate 2, an input electrode 9 and an output electrode 10 are formed at the left end and the right end respectively. The electrode 9 is electrically connected with the oscillation electrode 4b via a junction line 17, and the electrode 10 is electrically connected with the oscillation electrode 6b via a junction line 18.

Figure 2:
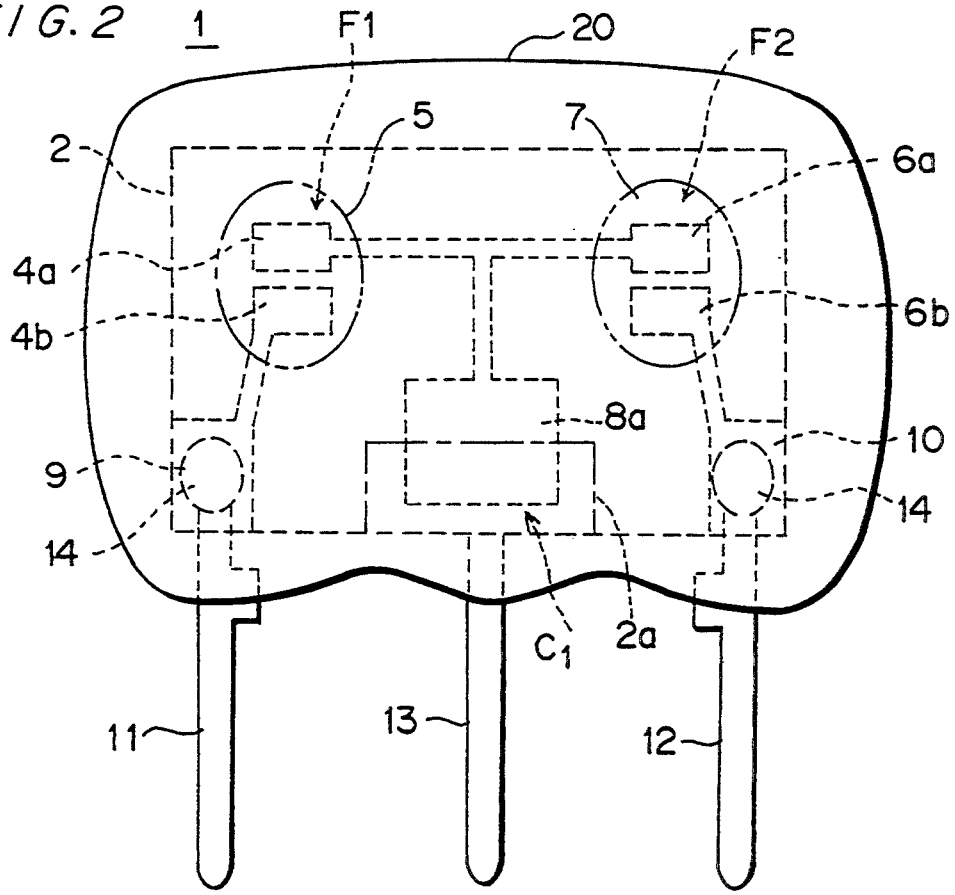
FIG. 2 is a plan view of the piezoresonator of the first embodiment.

Further, as shown in FIG. 2, according to the specification, an input terminal 11, an output terminal 12 and a common terminal 13 are joined and electrically connected to the input electrode 9, the output electrode 10 and the capacitor electrode 8b respectively by solder. The filter sections F1 and F2, that is, the oscillation electrodes 4a, 4b, 4c, 6a, 6b and 6c on the piezoelectric substrate 2 are coated with wax, paraffin or the like. Next, the piezoelectric substrate 2 is dipped into a melted armor resin, and the substrate 2 is exposed to heat. Thereby, the armor resin deposited on the substrate 2 is hardened, and the wax or the paraffin is melted and absorbed into the armor resin. Consequently, the piezoelectric substrate 2 is armored by an armor 20 with cavities 5 and 7 enclosing the filter sections F1 and F2. A heat-resisting and thermosetting resin, such as epoxy resin, is used as the armor 20.

Figure 3:
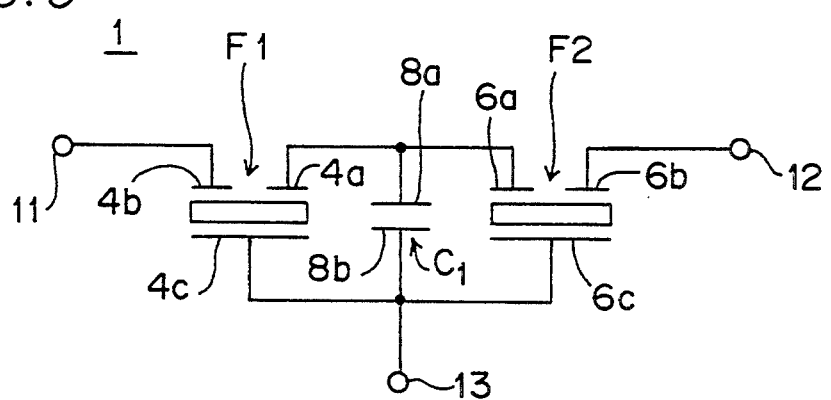
FIG. 3 is an electrical equivalent circuit diagram of the piezoresonator shown in FIG. 2.

FIG. 3 is an electrical equivalent circuit diagram of the piezoresonator 1 as fabricated above. The filter sections F1 and F2 are connected in parallel with the coupling capacitor section C1 in-between.

Figure 4:
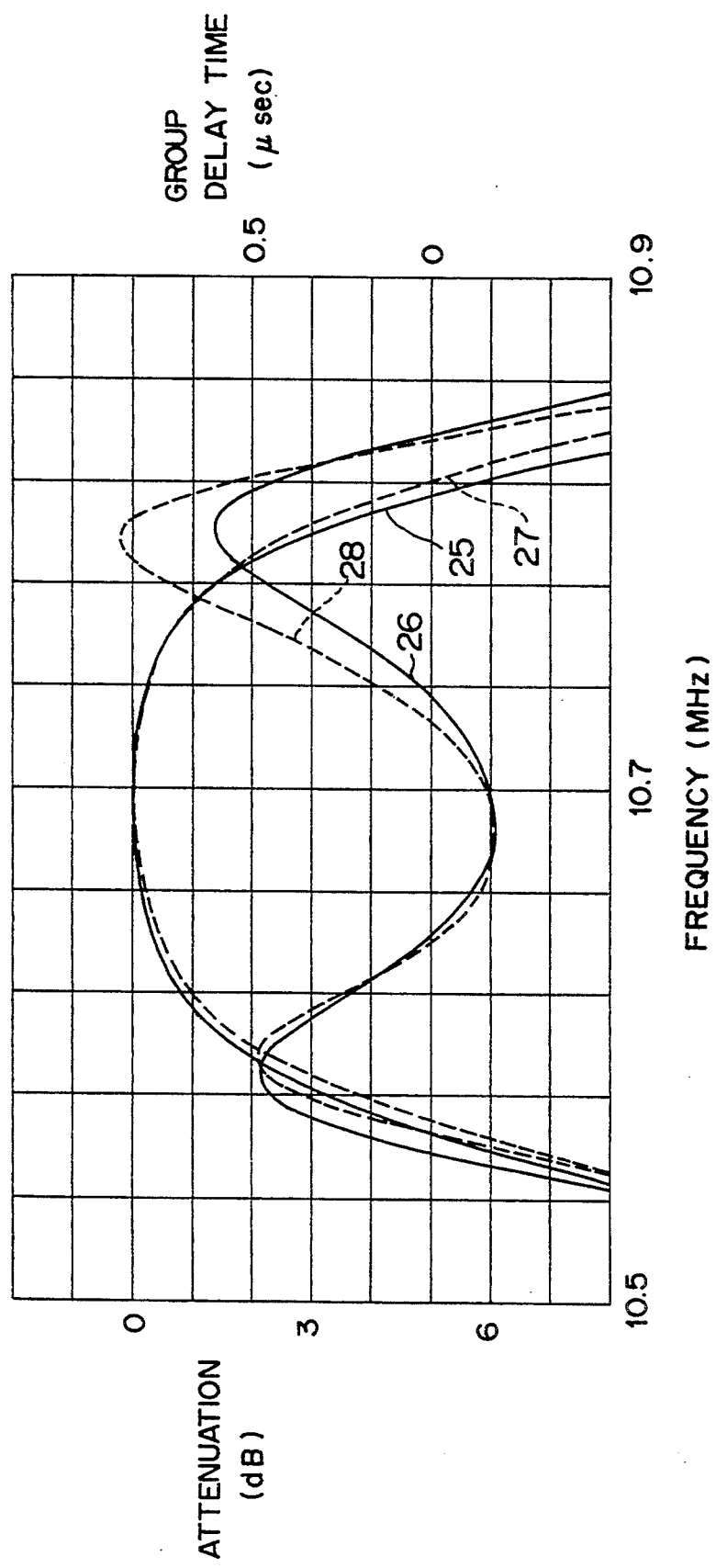
FIG. 4 is a graph showing the attenuation characteristic and the group delay characteristic of the piezoresonator shown in FIG. 2.

The piezoresonator 1 functions as a piezoelectric filter. FIG. 4 is a graph showing the attenuation characteristic and the group delay characteristic of the piezoresonator 1 and those of a comparative example. Solid lines 25 and 26 indicate respectively the attenuation characteristic and the group delay characteristic of the piezoresonator 1. Dashed lines 27 and 28 indicate respectively the attenuation characteristic and the group delay characteristic of a conventional piezoresonator wherein the portion of the piezoelectric substrate which holds the coupling capacitor section is entirely left unpolarized. As is apparent from the graph, the insertion loss of the piezoresonator 1 is as small as that of the conventional piezoresonator. Additionally, the piezoresonator 1 is better in the flatness of group delay characteristic than the conventional piezoresonator.

Figure 5:
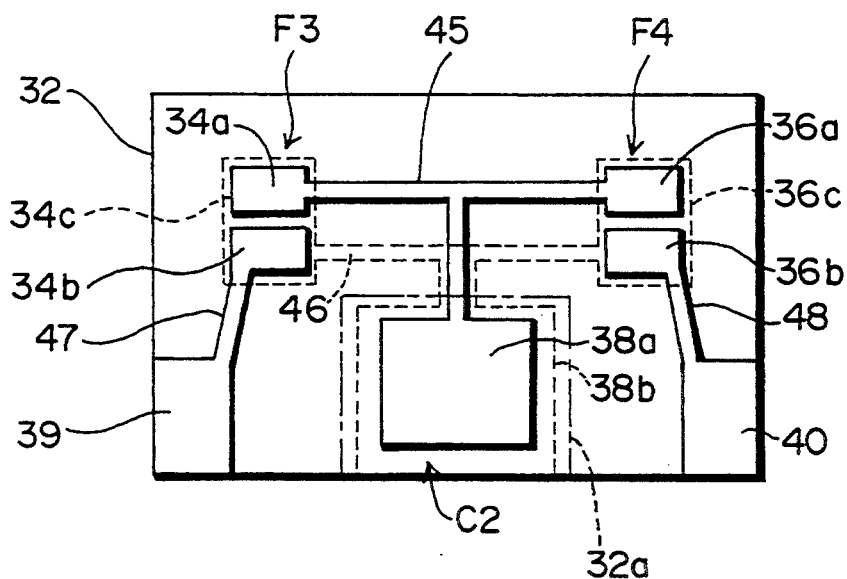
FIG. 5 is a plan view of a piezoelectric substrate of a piezoresonator which is a second embodiment of the present invention.
Figure 6:
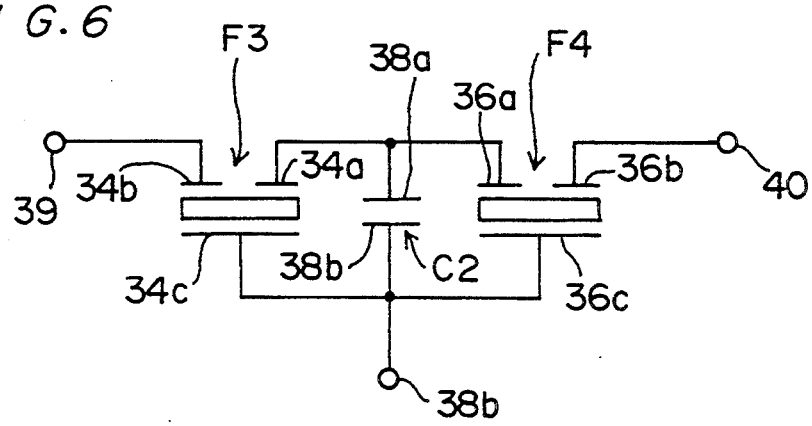
FIG. 6 is an electrical equivalent circuit diagram of the piezoelectric substrate shown in FIG. 5.

Second Embodiment: FIGS. 5 and 6

FIG. 5 shows a piezoelectric substrate 32 which is employed in a piezoresonator of a second embodiment. The piezoelectric substrate 32 has two filter sections F3 and F4, and a coupling capacitor section C2. The piezoelectric substrate 32 is polarized such that a portion 32a of the substrate 32 which holds the coupling capacitor section C2 (the portion 32a is enclosed by an alternate long and short dash line) has a lower intensity of polarization than the rest of the substrate 32. The polarization of the substrate 32 is carried out in the following process: first, a direct voltage is applied to the entire piezoelectric substrate 32 so as to polarize the entire substrate 32 with a high intensity; and next, a direct voltage with the inverse polarity of the former direct voltage, or alternatively, heat is applied to the portion 32a so as to lower the intensity of polarization of the portion 32a.

The filter section F3 comprises oscillation electrodes 34a and 34b which are formed on an upper side of the substrate 32 in the left, and an oscillation electrode 34c which is formed on a lower side of the substrate 32 facing the electrodes 34a and 34b. Likewise, the filter section F4 comprises oscillation electrodes 36a and 36b which are formed on the upper side of the substrate 32 in the right, and an oscillation electrode 36c which is formed on the lower side of the substrate 32 facing the electrodes 36a and 36b. The oscillation electrodes 34a and 36a are electrically connected with each other via the junction line 45, and the oscillation electrodes 34c and 36c are electrically connected with each other via the junction line 46.

The coupling capacitor section C2 comprises capacitor electrodes 38a and 38b which are formed on respectively the upper side and the lower side of the substrate 32 facing each other in the middle. The capacitor electrode 38a is electrically connected with the oscillation electrodes 34a and 36a via the junction line 45. The capacitor electrode 38b is electrically connected with the oscillation electrodes 34c and 36c via the junction line 46. A part of the capacitor electrode 38b also functions as a common electrode. Since the intensity of polarization of the portion 32a which holds the coupling capacitor section C2 is small, the coupling capacitor section C2 has a small dielectric loss. Accordingly, the piezoresonator has a small insertion loss.

On the upper side of the substrate 32, an input electrode 39 and an output electrode 40 are formed at the left end and the right end respectively. The electrodes 39 and 40 are electrically connected with the oscillation electrodes 34b and 36b via junction lines 47 and 48 respectively.

Further, as in the first embodiment, according to the specification, a lead terminal is joined and electrically connected to each of the capacitor electrode 38b, the input electrode 39 and the output electrode 40 by solder. Then, the piezoelectric substrate 32 is armored with the filter sections F3 and F4 enclosed by cavities in the same manner as described in the first embodiment. The piezoresonator finished in this way functions as a piezoelectric filter.

FIG. 6 shows the electric equivalent circuit of the piezoelectric substrate 32. The filter sections F3 and F4 are connected in parallel with the coupling capacitor section C2 in-between.

The insertion loss of the piezoresonator of the second embodiment is as small as that of a conventional piezoresonator wherein the portion of the substrate holding the coupling capacitor section is entirely left unpolarized. Additionally, since the portion 32a holding the coupling capacitor section C2 is polarized, the piezoresonator of the second embodiment is better in the flatness of group delay characteristic than the conventional piezoresonator.

Other Embodiments

Although the present invention has been described in connection with the preferred embodiments above, it is to be noted that various changes and modifications are possible to those who are skilled in the art. Such changes and modifications are to be understood as being within the scope of the invention.

The position and the area of the portion which is left unpolarized are variable depending on the specification.

The configurations of the oscillation electrodes and the capacitor electrodes and the layout of these electrodes on the piezoelectric substrate are not limited to the above embodiments.

There is another way of making the portion holding the coupling capacitor section has a lower intensity of polarization than the rest of the substrate. First, a direct voltage is applied to the entire piezoelectric substrate such that the substrate will be polarized with a low intensity. Then, a direct voltage higher than the former direct voltage is applied to the substrate other than the portion holding the coupling capacitor section. Consequently, the intensity of polarization of the portion holding the coupling capacitor section is kept low, while that of the rest of the substrate is heightened.

Further, the polarization of the piezoelectric substrate may be carried out either before or after the formation of the electrodes on the substrate.

What is claimed is:

1. A piezoresonator with a built-in capacitor, comprising:
    a piezoelectric substrate having a first surface and a second surface opposite said first surface;
    a plurality of oscillation sections as part of the piezoelectric substrate, each of the oscillation sections including a first oscillation electrode and a second oscillation electrode both being provided on the first surface of the piezoelectric substrate, and a third oscillation electrode provided on the second surface of the piezoelectric substrate opposite the first and second oscillation electrodes;
    a coupling capacitor section as part of the piezoelectric substrate for electrically connecting at least two adjacent oscillation sections, the coupling capacitor section including a first capacitor electrode on the first surface of the piezoelectric substrate and a second capacitor electrode on the second surface of the piezoelectric substrate opposite the first capacitor electrode, the first, capacitor electrode being electrically connected to at least one of the first and second oscillation electrodes of each adjacent oscillation section, the second capacitor electrode being electrically connected to the third oscillation electrode of each of the adjacent oscillation sections; and
    wherein the piezoelectric substrate is polarized, while a portion of the piezoelectric substrate which includes the coupling capacitor section is partly left unpolarized.

2. A piezoresonator as claimed in claim 1, wherein the piezoresonator is a piezoelectric filter which has two oscillation sections and a single coupling capacitor section for electrically connecting the oscillation sections.

3. A piezoresonator as claimed in claim 1, wherein substantially a half of the portion of the piezoelectric substrate which holds the coupling capacitor section is left unpolarized.

4. A piezoresonator as claimed in claim 1, further comprising:
    an armor which has cavities for enclosing the oscillation sections; and
    an input terminal, an output terminal and a common terminal which are protruded from the armor.

5. A piezoresonator as claimed in claim 1, further comprising:
    an input electrode provided on the first surface of the piezoelectric substrate, the input electrode being electrically connected to an oscillation electrode on the first surface of the piezoelectric substrate; and
    an output electrode provided on the first surface of the piezoelectric substrate, the output electrode being electrically connected to another of the oscillation electrodes on the first surface of the piezoelectric substrate.

6. A method for producing a piezoresonator with a built-in capacitor as claimed in claim 1, comprising the process of:
    polarizing the piezoelectric substrate such that a portion of the piezoelectric substrate which includes the coupling capacitor section is partly left unpolarized.

7. A piezoresonator with a built-in capacitor, comprising:
    a piezoelectric substrate having a first surface and a second surface opposite said first surface;
    a plurality of oscillation sections as part of the piezoelectric substrate, each of the oscillation sections including a first oscillation electrode and a second oscillation electrode both being provided on the first surface of the piezoelectric substrate, and a third oscillation electrode provided on the second surface of the piezoelectric substrate opposite the first and second oscillation electrodes;
    a coupling capacitor section as part of the piezoelectric substrate for electrically connecting at least two adjacent ones of the oscillation sections, the coupling capacitor section including a first capacitor electrode on the first surface of the piezoelectric substrate and a second capacitor electrode on the second surface of the piezoelectric substrate opposite the first capacitor electrode, the first capacitor electrode being electrically connected to at least one of the first and second oscillation electrodes of each adjacent oscillation section, the second capacitor electrode being electrically connected to the third oscillation electrode of each of the adjacent oscillation sections; and
    wherein the piezoelectric substrate is polarized such that a portion of the piezoelectric substrate which includes the coupling capacitor section has a lower intensity of polarization than the rest of the piezoelectric substrate.

8. A piezoresonator as claimed in claim 7, wherein the piezoresonator is a piezoelectric filter which has two oscillation sections and a single coupling capacitor section for electrically connecting the oscillation sections with each other.

9. A piezoresonator as claimed in claim 7, further comprising:
    an armor which has cavities for enclosing the oscillation sections; and
    an input terminal, an output terminal and a common terminal which are protruded from the armor.

10. A method for producing a piezoresonator with a built-in capacitor as claimed in claim 7, comprising the process of:
    polarizing the piezoelectric substrate such that a portion of the piezoelectric substrate which includes the coupling capacitor section has a lower intensity of polarization than the rest of the piezoelectric substrate.

11. The piezoresonator producing method as claimed in claim 10, wherein the polarizing process comprises the steps of:

applying a direct voltage entirely to the piezoelectric substrate so as to polarize the piezoelectric substrate with a high intensity; and applying a direct voltage with an inverse polarity of the former direct voltage to the portion which holds the coupling capacitor section so as to lower the intensity of polarization of the portion.

12. The piezoresonator producing method as claimed in claim 10, wherein the polarizing process comprises the steps of:

applying a direct voltage entirely to the piezoelectric substrate so as to polarize the piezoelectric substrate with a high intensity; and applying heat to the portion which holds the coupling capacitor section so as to lower the intensity of polarization of the portion.

13. The piezoresonator producing method as claimed in claim 10, wherein the polarizing process comprises the steps of:

applying a direct voltage entirely to the piezoelectric substrate so as to polarize the piezoelectric substrate with a low intensity; and applying a direct voltage higher than the former direct voltage to the piezoelectric substrate other than the portion which holds the coupling capacitor section so as to heighten the intensity of polarization of the piezoelectric substrate other than the portion which holds the coupling capacitor section.

14. A piezoresonator as claimed in claim 7, further comprising:

an input electrode provided on the first surface of the piezoelectric substrate, the input electrode being electrically connected to an oscillation electrode on the first surface of the piezoelectric substrate; and an output electrode provided on the first surface of the piezoelectric substrate, the output electrode being electrically connected to another of the oscillation electrodes on the first surface of the piezoelectric substrate.

* * * * *